(12) United States Patent
Yoon et al.

(10) Patent No.: US 10,127,999 B2
(45) Date of Patent: Nov. 13, 2018

(54) NONVOLATILE MEMORY AND SEMICONDUCTOR DEVICE INCLUDING THE SAME

(71) Applicant: SK hynix Inc., Gyeonggi-do (KR)

(72) Inventors: Hyun-Su Yoon, Gyeonggi-do (KR); Ki-Chang Kwean, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 80 days.

(21) Appl. No.: 15/269,599

(22) Filed: Sep. 19, 2016

(65) Prior Publication Data

US 2017/0004891 A1     Jan. 5, 2017

Related U.S. Application Data

(62) Division of application No. 14/106,549, filed on Dec. 13, 2013, now Pat. No. 9,471,420.

(30) Foreign Application Priority Data

Jun. 28, 2013   (KR) .......................... 10-2013-0075232

(51) Int. Cl.
| | | |
|---|---|---|
| *G11C 29/00* | (2006.01) | |
| *G06F 11/10* | (2006.01) | |
| *G11C 16/20* | (2006.01) | |
| *G11C 5/14* | (2006.01) | |
| *G11C 7/00* | (2006.01) | |
| *G11C 29/44* | (2006.01) | |

(52) U.S. Cl.
CPC .......... *G11C 29/78* (2013.01); *G06F 11/1068* (2013.01); *G11C 5/148* (2013.01); *G11C 7/00* (2013.01); *G11C 16/20* (2013.01); *G11C 29/44* (2013.01); *G11C 29/82* (2013.01); *G11C 2029/4402* (2013.01)

(58) Field of Classification Search
CPC ................. G06F 11/1068; G11C 16/20; G11C 2029/4402; G11C 29/82
See application file for complete search history.

(56) References Cited

U.S. PATENT DOCUMENTS

| | | | |
|---|---|---|---|
| 7,017,038 B1 * | 3/2006 | LaChance ............. | G06F 9/4403 713/2 |
| 8,782,389 B2 * | 7/2014 | Dolgunov ............... | G06F 21/80 713/1 |
| 2008/0244151 A1 * | 10/2008 | Leung ................. | G06F 12/0238 711/2 |
| 2015/0143198 A1 * | 5/2015 | Chun .................. | G06F 11/1072 714/768 |

* cited by examiner

*Primary Examiner* — Sam Rizk
(74) *Attorney, Agent, or Firm* — IP & T Group LLP

(57) ABSTRACT

A semiconductor device includes a usable address storage unit for selectively storing addresses of a plurality of memory sets using read data of the plurality of memory sets outputted from a nonvolatile memory during a boot-up operation; a register unit for storing the read data of the plurality of memory sets outputted from the nonvolatile memory during the boot-up operation; and an internal circuit for operating by using the read data of the plurality of memory sets stored in the register unit. Addresses corresponding to usable memory sets excluding already-used memory sets and defective memory sets among the memory sets of the nonvolatile memory are extracted and stored, and thus, although an address is not separately inputted when the nonvolatile memory is programmed, data may be programmed in a programmable (usable) memory set.

8 Claims, 4 Drawing Sheets

NONVOLATILE MEMORY AND SEMICONDUCTOR DEVICE INCLUDING THE SAME

CROSS-REFERENCE TO RELATED APPLICATIONS

This application is a division of U.S. patent application Ser. No. 14/106,549 filed on Dec. 13, 2013, which claims priority of Korean Patent Application No. 10-2013-0075232, filed on Jun. 28, 2013. The disclosure of each of the foregoing application is incorporated herein by reference in its entirety.

BACKGROUND

1. Field

Exemplary embodiments of the present invention relate to a non-volatile memory and a semiconductor device including the same.

2. Description of the Related Art

FIG. 1 illustrates a conventional memory device for describing a repair operation.

Referring to FIG. 1, the memory device includes a memory array 110, a row circuit 120, and a column circuit 130. The memory array 110 includes a plurality of memory cells to store data. The row circuit 120 is configured to activate a word line selected by a row address R_ADD. The column circuit 130 is configured to access a bit line selected by a column address to read or write the data.

A row fuse circuit 140 is configured to store a row address, corresponding to a defective memory cell within the memory array 110, as a repair row address REPAIR_R_ADD. The row comparator 150 is configured to compare the repair row address REPAIR_R_ADD stored in the row fuse circuit 140 to a row address R_ADD inputted from outside the memory device. When the repair row address REPAIR_R_ADD coincides with the row address R_ADD, the row comparator 150 controls the row circuit 120 to activate a redundancy word line place of a word line designated by the row address R_ADD. That is, a row (word line) corresponding to the repair row address REPAIR_R_ADD stored in the row fuse circuit 140 is replaced with a redundancy row (word line).

In FIG. 1, ACT represents a signal indicating that an active command for activating a word line is enabled, PRE represents a precharge command, RD represents a read command, and a WT represents a write command.

Conventionally, a laser fuse has been used as the fuse circuit 140. The laser fuse stores high or low data depending on whether the fuse is cut or not. The laser fuse may be programmed in a wafer state of a memory device, but may not be programmed after a wafer is mounted in a package. Furthermore, it may be difficult to design the laser fuse in a small size due to the lit it in reducing pitch.

To overcome such disadvantages, U.S. Pat. Nos. 6,904,751, 6,777,757, 6,667,902, 7,173,851 and 7,269,047 have been disclosed. According to the disclosures, one of nonvolatile memories such as E-fuse array, NAND (Not And) flash memory, NOR (Not Or) flash memory, MRAM (Magnetic Random Access Memory), STT-MRAM (Spin Transfer magnetic Random Access Memory), ReRAM (Resistive Random Access Memory) and PC RAM (Phase Change Random Access Memory) is included in a memory device, and repair information (repair address) is stored in the nonvolatile memory and then used.

FIG. 2 illustrates the memory device including a nonvolatile memory to store repair information.

Referring to FIG. 2, it can be seen that the fuse circuit 140 is removed from the memory device of FIG. 1 and a nonvolatile memory 210 and a register 220 are added to the memory device.

The nonvolatile memory 210 replaces the fuse circuit 140. The nonvolatile memory 210 stores a row address, corresponding to a defective memory cell within the memory array 110, as a repair row address. The nonvolatile memory 210 may include any one of nonvolatile memories such as E-fuse array, NAND flash memory, NOR flash memory, MRAM (Magnetic Random Access Memory), STT-MRAM (Spin Transfer magnetic Random Access Memory), ReRAM (Resistive Random Access Memory), and PC RAM (Phase Change Random Access Memory).

The register 220 suitable for receiving repair information (that is, the repair row address) stored in the nonvolatile memory 210 and storing the received repair information subsequently the repair information stored in the register 220 is used for a repair operation. The register 220 includes latch circuits, and may store repair information only while power is supplied. An operation of transmitting repair information from the nonvolatile memory 210 to the register 220 and storing the repair information therein is referred to as a boot-up operation.

The reason that the repair information stored in the nonvolatile memory 210 is not directly used but transferred to the register 220, stored and used is as follows. Since the nonvolatile memory 210 is formed in an array shape, a predetermined time is required to call data stored in the nonvolatile memory 210. Since data may not be immediately called the data stored in the nonvolatile memory 210 may not be directly used to perform a repair operation. Thus, the boot-up operation of transferring the repair information stored in the nonvolatile memory 210 to the register 220 to store the repair information is performed, and the data stored in the register 220 is then used to perform a repair operation.

When the fuse circuit 140 implemented with a laser fuse is replaced with the nonvolatile memory 210 and the register 220, an additional defect caused and discovered after a wafer state may be repaired. Research is being conducted on technology for accessing the nonvolatile memory in the memory device even after the memory device is fabricated (for example, after a product is sold) and repairing a defect caused after the memory device is fabricated.

SUMMARY

Various embodiments are directed to a technique for determining an address of a usable memory set in a nonvolatile memory.

In an embodiment, a nonvolatile memory includes a plurality of memory sets, wherein each of the memory sets includes a first memory cell suitable for storing a validity signal indicating data validity of the corresponding memory set, and second memory cells suitable for storing multi-bit data or one or more-bit defect information.

In another embodiment, a semiconductor device includes a nonvolatile memory including a plurality of memory sets, a control unit suitable for controlling read operations to be sequentially performed on the plurality of memory sets during a boot-up operation, a usable address storage unit suitable for selectively storing addresses of the plurality of memory sets using read data of the plurality of memory sets outputted from the nonvolatile memory during the boot-up operations a register table for storing the read data of the plurality of memory sets outputted from the nonvolatile memory during the boot-up operation, and an internal circuit suitable for operating using the read data of the plurality of memory sets, stored in the register unit.

In yet another embodiment, a memory device includes a memory array comprising a plurality of memory cells, a nonvolatile memory comprising a plurality of memory sets and suitable for storing defect addresses indicating the positions of defective memory cells among the memory cells, a control unit suitable for controlling read operations to be sequentially performed on the plurality of memory sets during a boot-up operation, a usable address storage unit suitable for selectively storing addresses of the plurality of memory sets using read data of the plurality of memory sets outputted from the nonvolatile memory during the boot-up operation, and a register unit suitable for storing the read data of the plurality of memory sets outputted from the nonvolatile memory during the boot-up operation.

In still another embodiment, a semiconductor device includes a nonvolatile memory comprising a plurality of memory sets, a register unit suitable for reading and storing data of the plurality of memory sets, a usable address storage unit suitable for selectively storing addresses of the plurality of memory sets in response to the data of the plurality of memory sets, and a control unit suitable for performing a read operation on the plurality of memory sets sequentially and performing a program operation to program the nonvolatile memory using the addresses stored in the usable address storage unit or addresses applied from the outside of the semiconductor device.

DETAILED DESCRIPTION

Figure 1:
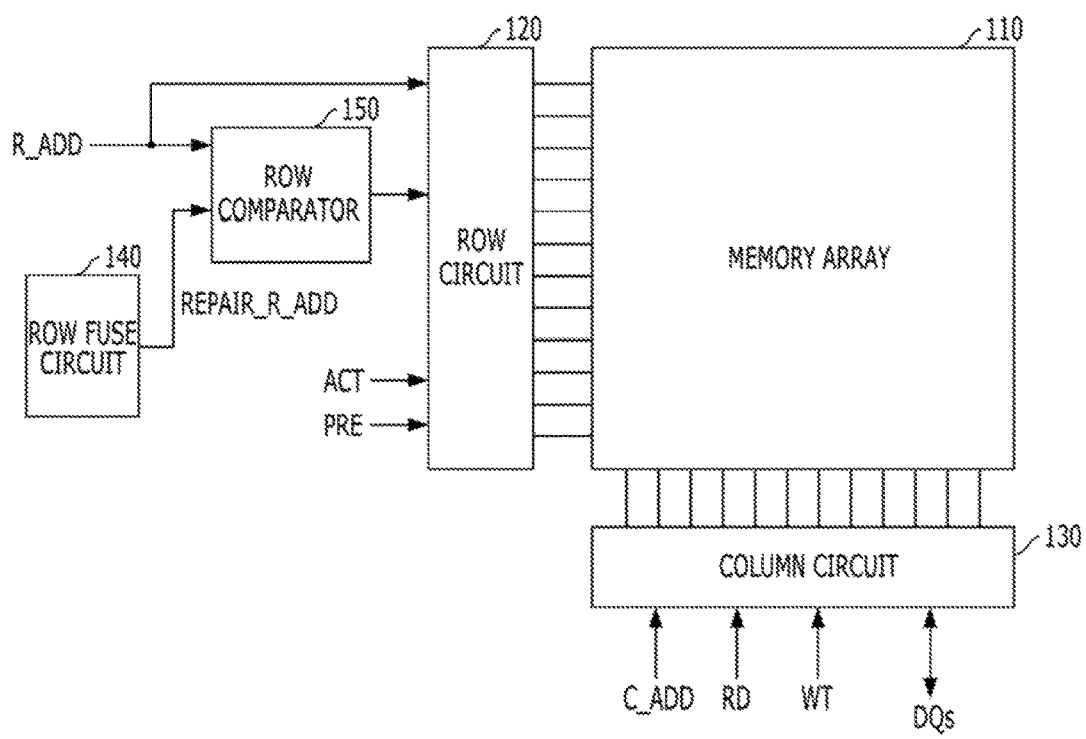
FIG. 1 illustrates a conventional memory device for describing a repair operation.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and some instances, proportions may have been exaggerated in order to clearly illustrate features of the embodiments. In this specification, specific terms have been used. The terms are used to describe the present invention, and are not used to qualify the sense or limit the scope of the present invention.

When a first layer is referred to as being "on" a second layer or "on" a substrate, it not only refers to a case where the first layer formed directly on the second layer or the substrate but also a case where a third layer exists between the first layer and the second layer or the substrate. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
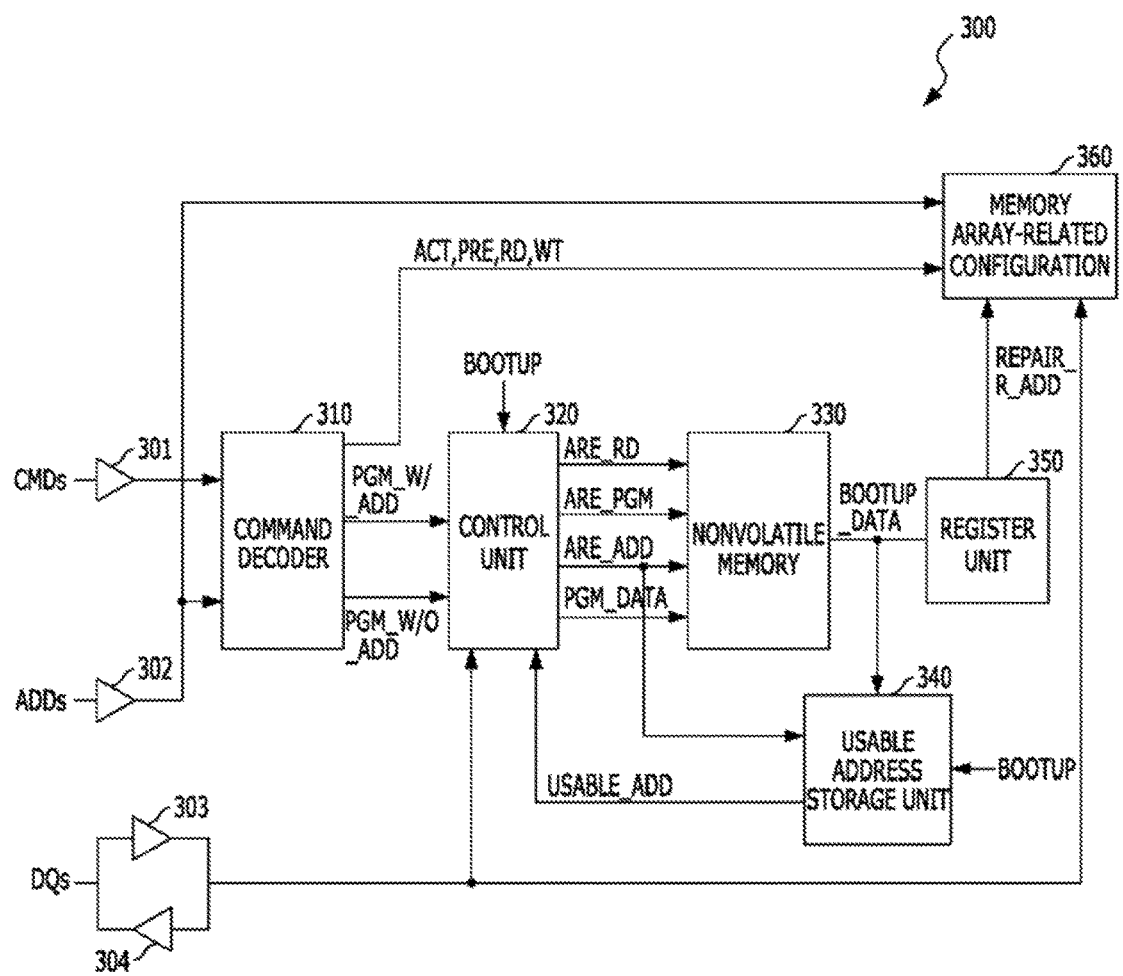
FIG. 3 is a configuration diagram illustrating a memory device 300 in accordance with an embodiment of the present invention.

FIG. 3 is a configuration diagram illustrating a memory device 300 in accordance with an embodiment of the present invention.

Referring to FIG. 3, the memory device 300 includes a command input unit 301, an address input unit 302, a data input unit 303, a data output unit 304, a command decoder 310, a control unit 320, a nonvolatile memory 330, a usable address storage unit 340, a register unit 350, and a memory array-related configuration 360. The names of the command input unit 301, the address input unit 302, the data input unit 303, and the data output unit 304 are defined on the basis of the memory array-related configuration 360. For example, although an address of the memory array-related configuration 360 is inputted through the address input unit 302, program data of the nonvolatile memory 330 may be inputted through the address input unit 302, and although data of the memory array-related configuration 360 is inputted through the data input unit 303, an address of the nonvolatile memory 330 may be inputted through the data input unit 303.

The command input unit 301 suitable for receiving command signals CMDs inputted from outside the memory device 300. The command signals CMDs may include a chip select signal CS, an active signal ACT, a row address strobe signal RAS, a column address strobe signal CAS, and a write enable signal WE.

The address input unit 302 is suitable for receiving multi-bit addresses ADDs inputted from outside the memory device 300. The address ADDs may include a bank group address and a bank address as well as normal/common addresses indicating a row address and a column address. The row address and the column address are inputted through the same pad. The memory device 300 recognizes an add mss inputted in synchronization with the row address strobe signal RAS as a row address, and recognizes an address inputted in synchronization with the column address strobe signal CAS as a column address.

The data input unit 303 is suitable for receiving multi-bit data DQs inputted from outside the memory device 300, and the data output unit 304 is suitable for outputting the multi-bit data DQs stored inside to the outside of the memory device 300. For example, data to be written in the memory array-related configuration 360 of the memory device 300 is inputted through the data input unit 303, and data read from the memory array related-configuration 360 is outputted through the data output unit 304.

The command decoder 310 is suitable for decoding the command signals CMDs inputted through the command input unit 301 and generate internal command signals. When the command decoder 310 generates the internal command signals, a part of the address signals ADDs inputted through the address input unit 302 as well as the command signals CMDs inputted through the command input unit 301 may be used. The internal command signals may include an active command ACT, a precharge command PRE, a read command RD, a write command WT and the like. The commands ACT, PRE, RD, and WT are transmitted to the memory array-related configuration 360.

The command decoder 310 may combine the command signals CMDs inputted through the coma and input unit 301 and a part of the address signals ADDs inputted through the address input unit 302 and generate internal command signals related to the nonvolatile memory 330. The internal command signals related to the nonvolatile memory 330 may include a program command with address PGM_W/_ADD and a program command without address PGM_W/O_ADD. The program command with address PGM_W/_ADD is a command indicating a programi operaindicates whether the memory set is used (that is, a defect address is stored in the memory set) or not used (that is, no defect address is stored in the memory set). The memory set includes a plurality of memory cells. Among the plurality of memory cells, a memory cell storing the validity signal EN is referred to as a validity memory cell, and memory cells storing a defect address A<0:N> are referred to as data memory cells. Table 1 shows the form of information stored in the memory sets within the nonvolatile memory 330.

TABLE 1

| Memory set | Stored information | | | | | | | | | | | | |
|---|---|---|---|---|---|---|---|---|---|---|---|---|---|
| | EN | A<0> | A<1> | A<2> | A<3> | A<4> | A<5> | A<6> | A<7> | A<8> | ... | A<N−1> | A<N> |
| 1 | 1 | 1 | 1 | 0 | 1 | 0 | 0 | 0 | 1 | 1 | ... | 0 | 1 |
| 2 | 1 | 0 | 1 | 0 | 1 | 1 | 1 | 0 | 1 | 0 | ... | 1 | 0 |
| 3 | 1 | 0 | 1 | 1 | 0 | 0 | 1 | 0 | 1 | 1 | ... | 0 | 0 |
| 4 | 0 | 1 | 0 | 0 | 0 | 0 | 0 | 0 | 0 | 0 | ... | 0 | 0 |
| 5 | 1 | 1 | 0 | 0 | 0 | 0 | 1 | 1 | 0 | 1 | ... | 0 | 1 |
| ... | ... | ... | ... | ... | ... | ... | ... | ... | ... | ... | ... | ... | ... |
| 118 | 1 | 0 | 0 | 1 | 1 | 0 | 0 | 1 | 1 | 1 | ... | 0 | 1 |
| 119 | 1 | 1 | 0 | 1 | 0 | 1 | 0 | 1 | 1 | 0 | ... | 1 | 1 |
| 120 | 1 | 0 | 1 | 0 | 1 | 0 | 1 | 0 | 0 | 1 | ... | 0 | 0 |
| 121 | 1 | 0 | 1 | 0 | 0 | 1 | 0 | 0 | 0 | 1 | ... | 1 | 1 |
| 122 | 0 | 0 | 0 | 0 | 0 | 0 | 0 | 0 | 0 | 0 | ... | 0 | 0 |
| 123 | 0 | 0 | 0 | 0 | 0 | 0 | 0 | 0 | 0 | 0 | ... | 0 | 0 |
| 124 | 0 | 0 | 0 | 0 | 0 | 0 | 0 | 0 | 0 | 0 | ... | 0 | 0 |
| 125 | 0 | 1 | 0 | 0 | 0 | 0 | 0 | 0 | 0 | 0 | ... | 0 | 0 |
| 126 | 0 | 0 | 0 | 0 | 0 | 0 | 0 | 0 | 0 | 0 | ... | 0 | 0 |
| 127 | 0 | 0 | 0 | 0 | 0 | 0 | 0 | 0 | 0 | 0 | ... | 0 | 0 |
| 128 | 0 | 0 | 0 | 0 | 0 | 0 | 0 | 0 | 0 | 0 | ... | 0 | 0 | tion in which program data to be programmed in the nonvolatile memory 330 and an address for designating where the program data is to be programmed the nonvolatile memory 330 are applied from outside the memory device 300. The program data includes a defect address indicating the position of a defect (i.e., a defective cell) in the memory array-related configuration 360. The program command without address PGM_W/O_ADD is a command indicating a program operation in which program data to be programmed in the nonvolatile memory 330 is applied from outside the memory device 300 but an address for designating where the program data is to be programmed in the nonvolatile memory 330 is not applied from outside the memory device 300.

Figure 2:
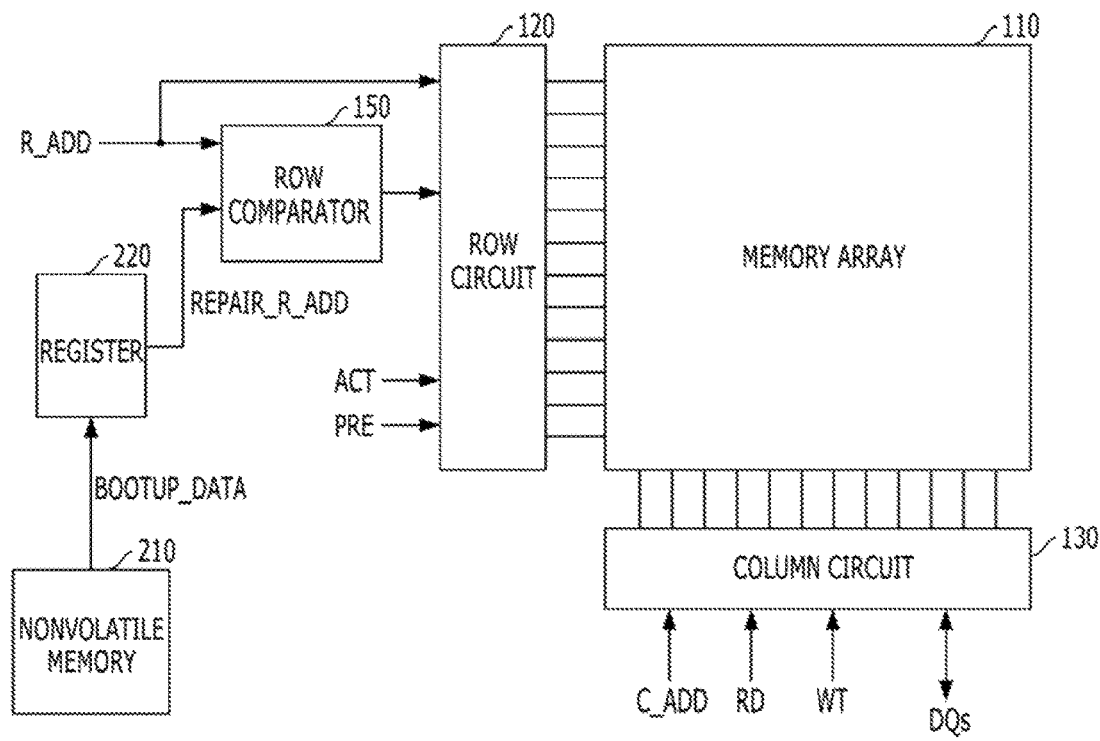
FIG. 2 illustrates the memory device including a nonvolatile memory to store repair information.

The memory array-related configuration 360 includes the memory array 110, the row circuit 120, the column circuit 130, and the row comparator 150, which are illustrated in FIG. 2. The memory array related configuration 360 performs an operation of reading/writing data from/in the memory array 110 in response to a command of the command decoder 310. A defective cell within the memory array 110 is replaced with a redundancy cell by using repair information BOOTUP_DATA transmitted from the nonvolatile memory 330 to the register unit 350.

The nonvolatile memory 330 stores a defect address indicating the position of a defective cell in the memory array 110. The nonvolatile memory 330 includes a plurality of memory sets. During a boot-up operation of transmitting data of the nonvolatile memory 330 to the register unit 350, read operation of reading data stored in the nonvolatile memory 330 is repetitively performed. During each read operation, data of one memory set may be read. The data of one memory set includes a validity signal EN and a defect address A<0:N>, the validity signal EN indicating the validity of the data of the memory set. The validity signal EN Referring to Table 1, the nonvolatile memory 330 includes 128 memory sets, and each of the memory sets includes (N+2) memory cells. The 128 memory sets may be classified into three kinds of memory sets. Hereafter, the classification standard will be described.

(1) Used Memory Set

A used memory set indicates a memory set in which a valid defect address A<0:N> is already stored and a defect address A<0:N> cannot be programmed any more. Among the memory sets, a memory set including a programmed validity memory cell, that is, a memory set in which the validity signal EN is '1', corresponds to a used memory set. Among the memory sets shown in Table 1, first second, third, fifth . . . 118th, 119th, 120th and 121st memory sets are classified into used memory sets.

(2) Unused Defective Memory Set

An unused defective memory set indicates a memory set in which a valid defect address A<0:N> is not stored but a defect address A<0:N> cannot be programmed because the memory set has an error (for example one or more memory cells of the memory set have a defect). Among the memory sets, a memory set in which the validity memory cell is not programmed but one or more of the data cells (for example, a data memory cell to store a defect address A<0>) are programmed, that is a memory set in which the validity signal EN is '0' and the defect address A<0> is '1', correspond to a defective memory set. Among the memory sets shown in Table 1, fourth and 125th memory sets correspond to defective memory sets. Such memory sets may be discovered during a test, and the defect address A<0> may be programmed as '1'.

(3) Unused Normalmemory Set

An unused normalmemory set indicates a memory set in which a valid defect address A<0:N> is not stored and a defective address A<0:N> may be programmed because the memory set has no error. Among the memory sets, a memory set in which the validity memory cell is not programmed and the data memory cells are not programmed, that is, a memory set in which the validity signal EN is '0' and all bits of the defect address A<0:N> are '0', correspond to an unused normalmemory set. Among the memory sets shown in Table 1, 122nd, 123rd, 124th, 126th, 127th and 128th memory sets correspond to unused normalmemory sets, that is, usable memory sets.

The nonvolatile memory 330 including a plurality of memory sets having a data structure as shown in Table 1 may include one of E-fuse array, NAND flash memory, NOR flash memory, MRAM (Magnetic Random Access Memory), STT-MRAM (Spin Transfer magnetic Random Access Memory), ReRAM (Resistive Random Access Memory), and PC RAM (Phase Change Random Access Memory).

The control unit 320 is suitable for controlling the operation of the nonvolatile memory 330. The control unit 320 performs a boot-up operation of transmitting data stored in the nonvolatile memory 330 to the register unit 350 during a boot-up operation period in which a boot-up signal BOOTUP of the memory device 300 is activated. The control unit 320 enables/activates a read signal ARE_RD a plurality of times while changing an address ARE_ADD applied to the nonvolatile memory 330 during the boot-up operation period. That is the control unit 320 controls the nonvolatile memory 330 such that read operations for the memory sets of the nonvolatile memory 330 are sequentially performed. For example, when the nonvolatile memory 330 includes 128 memory sets as shown in Table 1, 128 read operations may be performed during the boot-up operation period, while a memory set on which a read operation is performed is changed. The address ARE_ADD applied to the nonvolatile memory during the boot-up operation period may be generated by counting an address in the controller unit 320. The boot-up signal BOOTUP is a signal which is enabled/activated during an initialization operation of the memory device 300, and it may be enabled/activated in response to an initialization signal (for example, a reset signal) inputted from outside the memory device 300.

The control unit 320 has control of programming data (defect address) inputted from outside the memory device 300 in a position within the nonvolatile memory 330, designated by an address inputted from outside the memory device 300, when the program command with address PGM_W/_ADD is enabled. During the program operation with address, the control unit 320 enables a program signal ARE_PGM, transfers an address inputted from outside the memory device 300 as an address ARE_ADD to the nonvolatile memory 330, and transfers the data inputted from outside the memory device 300 as program data PGM_DATA to the nonvolatile memory 330. The address and data inputted from outside the memory device 300 may be transferred to the control unit 320 through the data input unit 303.

The control unit 320 has control of programming data (defect address) inputted from outside the memory device 300 in a position within the nonvolatile memory 330, designated by an address USABLE_ADID transferred from the usable address storage unit 340, when the program command without address PGM_W/O_ADD is enabled. During the program operation without address, the control unit 320 enables the program signal ARE_PGM, transfers the address USABLE_ADD received from the usable address storage unit 340 as an address ARE_ADD to the nonvolatile memory 330, and transfers the data inputted from outside the memory device 300 as program data PGM_DATA to the nonvolatile memory 330. The data inputted from outside the memory device 300 may be transferred to the control unit 320 through the data input unit 303.

The register unit 350 receives boot-up data BOOTUP_DATA (defect address) outputted from the nonvolatile memory 330 during the boot-up operation, and stores the received data. The defect address stored in the register unit 350 through the boot-up operation is used to replace defective memory cells of the memory array 110 within the memory array-related configuration 360 with redundancy memory cells.

The usable address storage unit 340 deterrrr determines usable memory set (an unused nemory set) using the boot-up data BOOTUP_DATA outputted from the nonvolatile memory during the boot-up operation, and stores an address of the determined usable memory set as a usable address USABLE_ADD. Furthermore, the usable address USABLE_ADD stored in the usable address storage unit 340 is transferred to the control unit 320 during a program operation without address, and used to program the nonvolatile memory 330 by the control unit 320. The usable address storage unit 340 will be described in more detail with reference to FIG. 4.

Figure 4:
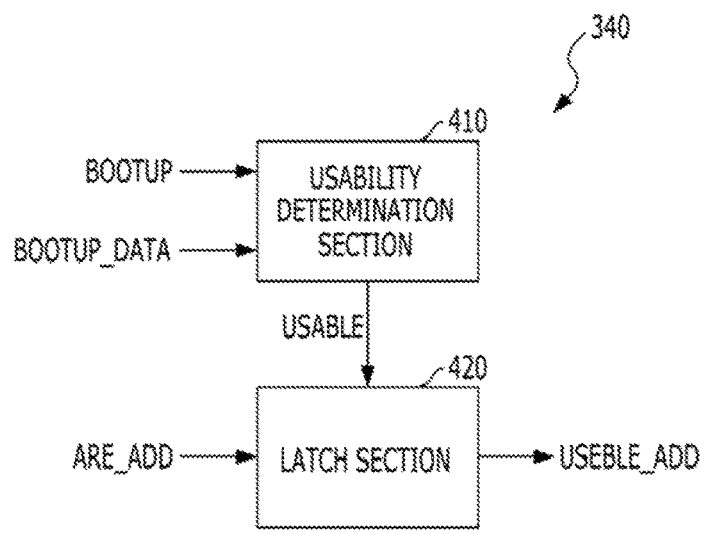
FIG. 4 is a configuration diagram illustrating a usable address storage unit 340 of FIG. 3.

FIG. 4 illustrates a configuration diagram of the usable address storage unit 340 of FIG. 3.

Referring to FIG. 4, the usable address storage unit 340 includes a usability determination section 410 and a latch section 420.

The usability determination section 410 is activated during the boot-up operation period in which the boot-up signal BOOTUP is enabled, and receives the boot-up data BOOTUP_DATA to determine whether a memory set on which a read operation is being performed is usable or not. The determination of whether a memory set on which a read operation is being performed is usable or not may be performed by checking the logic values of a validity signal EN and an address A<0> of the boot-up data BOOTUP_DATA read from the memory set. When the memory set on which a read operation is being performed is an already-used memory set or a defective memory set, the usability determination section 410 disables/deactivates a usable signal USABLE, and when the memory set on which a read operation is being performed is an unused memory cell, the usability determination section 410 enables/activates the usable signal USABLE. For example, the usability determination section 410 disables the usable signal USABLE n a read operation is performed for the third memory set of Table 1, corresponding to a used memory set, and enables the usable signal USABLE when a read operation is performed for the 124th memory set of Table 1, corresponding to an unused memory set.

The latch section 420 latches the address ARE_ADD transferred to the nonvolatile memory 330 from the control unit 320, when the usable signal USABLE is enabled. Through such an operation, addresses corresponding to usable memory sets within the nonvolatile memory 330 (for example, 122nd, 123rd, 124th, 126th, 127th and 128th memory sets in Table 1) may be stored in the latch section 420. The addresses USABLE_ADD corresponding to usable sets, stored in the latch section 420, may be transferred to the control unit 320 and then used, during a program operation without address.

Figure 5:
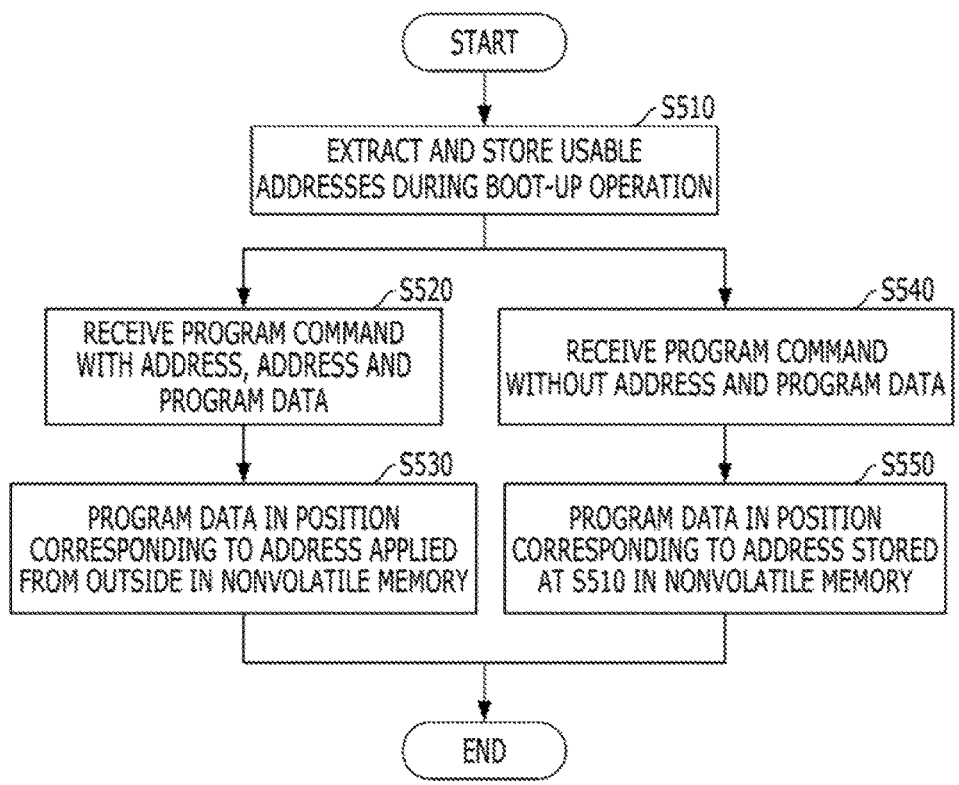
FIG. 5 is a diagram illustrating operations of components related to a nonvolatile memory 330 in the memory device of FIG. 3.

FIG. 5 is a diagram illustrating operations of the components related to the nonvolatile memory 330 in the memory device of FIG. 3.

Referring to FIG. 5, a boot-up operation of the nonvolatile memory 330 is performed during an initialization operation of the memory device 300, and addresses of usable memory sets among the memory sets of the nonvolatile memory 330 are stored in the usable address storage unit 340 during the boot-up operation, at step S510. During a period in which power is supplied to the memory device 300 and the memory device 300 is initialized, the boot-up operation of transmitting data stored in the nonvolatile memory 330 to the register unit 350 is performed. During the boot-up operation, read operations for aid n memory sets of the nonvolatile memory 330 are performed. For example, a plurality of read operations from the first to 128th memory sets of Table 1, are sequentially performed. When the read operations for the usable memory sets are performed during the boot-up operation, addresses corresponding to the usable memory sets are stored in the usable address storage unit 340. For example, while read operations for the 122nd, 123rd, 124th 126th, 127th and 128th memory sets among the memory sets of Table 1 are performed, addresses corresponding to the memory sets are stored in the usable address storage unit 340.

When a program command with address PGM_W/_ADD is applied from outside the memory device 300, an address ARE_ADD of the nonvolatile memory 330 and program data PGM_DATA are inputted from outside the memory device 300 at step S520. The program command with address PGM_W/_ADD may be activated through a combination of various command signals CMDs inputted through the command input unit 301, and the address ARE_ADD of the nonvolatile memory 330 and the program data PGM_DATA may be inputted through the data input unit 303. The program data PGM_DATA applied from outside the memory device 300 is programmed in a place within the nonvolatile memory 330, designated by the address ARE_ADD applied from outside the memory device 300, at step S530. In order to perform a program operation using the program command with address PGM_W/_ADD, usable memory sets within the nonvolatile memor 330 are recognized. Thus, the program operation generally performed by a maker of the memory device 300 during a fabrication process of the memory device 300.

When a program command without address PGM_W/O_ADD is applied from outside the memory device 300, program data PGM_DATA to be programmed in the nonvolatile memory 330 are inputted from outside the memory device 300 at step S540. In this case, the address ARE_ADD of the nonvolatile memory 330 for the program data PGM_DATA to be programmed is not inputted from outside the memory device 330. The program command without address PGM_W/O_ADD may be activated through a combination of rios command signals CMDs inputted through the command input unit 301, and the program data PGM_DATA of the nonvolatile memory 330 may be inputted through the data input unit 303. During the program operation by the program command without address PGM_W/O_ADD, a usable address USABLE_ADD is transferred from the usable address storage unit 340 as the address ARE_ADD of the nonvolatile memory 330, and the program data PGM_DATA is programmed in a place designated by the address ARE_ADD (USABEL_ADD) within the nonvolatile memory 330. During the program operation by the program command without address PGM_W/O_ADD, a programmable memory set of the nonvolatile memory 330 is selected and programmed even though an address is not inputted from outside the memory device 300. This means that the program operation is performed without recognizing usable memory sets in the nonvolatile memory 330. Thus, a user cannot recognize the use state of the nonvolatile memory 300 may easily program the nonvolatile memory 330 using the program command without address PGM_W/O_ADD, after the memory device 300 is fabricated.

In accordance with the embodiments of the present invention, addresses corresponding to usable memory sets excluding already-used memory sets and defective memory sets among the memory is of the nonvolatile memory are extracted and stored. Thus, although an address is not separately inputted when the nonvolatile memory is programmed, data may be programmed in a programmable (usable) memory set.

Although various embodiments have been described for illustrative purposes, it will be apparent to those skilled in the art that various changes and modifications may be made without departing from the spirit and scope of the invention as defined in the following claims.

In the above-described embodiments, the emery device 300 includes the nonvolatile memory 330 and stores the information for repairing the memory array-related configuration therein. However, a nonvolatile memory may be applied to a general semiconductor device and store any information to be used in the semiconductor device.

Furthermore, in the above-described embodiments, only 128 memory sets are included in the nonvolatile memory. However, several thousand to several hundred thousand memory sets may be included inside the nonvolatile memory. Furthermore, the above described embodiments are based on the operation that a defect row address is stored in the nonvolatile memory and used to repair a row of the memory array. However, a defect column address may be used to repair a column.

What is claimed is:

1. A semiconductor device comprising:
   a nonvolatile memory comprising a plurality of memory sets;
   a control unit controlling read operations to be sequentially performed on the plurality of memory sets during a boot-up operation;
   a usable address storage unit selectively storing addresses of the plurality of memory sets using read data of the plurality of memory sets outputted from the nonvolatile memory during the boot-up operation;
   a register unit storing the read data of the plurality of memory sets outputted from the nonvolatile memory during the boot-up operation; and
   an internal circuit operating by using the read data of the plurality of memory sets stored in the register unit,
   wherein each of the memory sets comprises:
      a first memory cell storing a validity signal indicating data validity of the corresponding memory set; and
      second memory cells storing multi-bit data when the validity signal indicates valid and storing defect information indicating whether the corresponding memory set is defective when the validity signal indicates invalid, wherein one second memory cell of the second memory cells stores one bit of the multi-bit data when the validity signal indicates valid and the one second memory cell stores the defect information when the validity signal indicates invalid.

2. The semiconductor device of claim 1, wherein the usable address storage unit stores addresses of usable memory sets which are memory sets other than used or defective memory sets among the plurality of memory sets.

3. The semiconductor device of claim 2, wherein the usable address storage unit comprises:
- a usability determination section determining whether a memory set on which a read operation is performed is a usable memory set or not; and
- a latch section storing an address corresponding to a memory set determined as a usable memory set by the usability determination section.

4. The semiconductor device of claim 1, wherein the address stored in the usable address storage unit is used to designate a memory set on which a program operation is to be performed during a program operation of the nonvolatile memory.

5. The semiconductor device of claim 1, wherein when a command to program the nonvolatile memory with an address is applied to the semiconductor device from the outside, program data is programmed in a memory set corresponding to the address applied from the outside in the nonvolatile memory, and
- when a command to program the nonvolatile memory without an address is applied to the semiconductor device from the outside, program data is programmed in a memory set corresponding to the address stored in the usable address storage unit in the nonvolatile memory.

6. A memory device comprising:
- a memory array comprising a plurality of memory cells;
- a nonvolatile memory comprising a plurality of memory sets and storing defect addresses indicating the positions of defective memory cells among the memory cells;
- a control unit controlling read operations to be sequentially performed on the plurality of memory sets during a boot-up operation;
- a usable address storage unit selectively storing addresses of the plurality of memory sets using read data of the plurality of memory sets outputted from the nonvolatile memory during the boot-up operation; and
- a register unit storing the read data of the plurality of memory sets outputted from the nonvolatile memory during the boot-up operation,
- wherein each of the memory sets comprises:
  - a first memory cell storing a validity signal indicating data validity of the corresponding memory set; and
  - second memory cells storing multi-bit data when the validity signal indicates valid and storing defect information indicating whether the corresponding memory set is defective when the validity signal indicates invalid, wherein one second memory cell of the second memory cells stores one bit of the multi-bit data when the validity signal indicates valid and the one second memory cell stores the defect information when the validity signal indicates invalid.

7. The memory device of claim 6, wherein the read data of the plurality of memory sets, stored in the register unit, are used to replace the defective memory cells within the memory array with redundancy memory cells.

8. The memory device of claim 6, wherein the usable address storage unit stores an address of the unused normal memory set among the plurality of memory sets.

* * * * *